(12) United States Patent
Kimura et al.

(10) Patent No.: US 9,883,588 B2
(45) Date of Patent: Jan. 30, 2018

(54) ORIENTED COPPER PLATE, COPPER-CLAD LAMINATE, FLEXIBLE CIRCUIT BOARD, AND ELECTRONIC DEVICE

(71) Applicant: NIPPON STEEL & SUMITOMO METAL CORPORATION, Tokyo (JP)

(72) Inventors: Keiichi Kimura, Tokyo (JP); Tomohiro Uno, Tokyo (JP); Kazuaki Kaneko, Kisarazu (JP)

(73) Assignee: NIPPON STEEL & SUMITOMO METAL CORPORATION, Tokyo (JP)

( * ) Notice: Subject to any disclaimer, the term of this patent is extended or adjusted under 35 U.S.C. 154(b) by 0 days.

(21) Appl. No.: 15/533,195

(22) PCT Filed: Dec. 11, 2015

(86) PCT No.: PCT/JP2015/084822
§ 371 (c)(1),
(2) Date: Jun. 5, 2017

(87) PCT Pub. No.: WO2016/093349
PCT Pub. Date: Jun. 16, 2016

(65) Prior Publication Data
US 2017/0332489 A1 Nov. 16, 2017

(30) Foreign Application Priority Data

Dec. 12, 2014 (JP) .................................. 2014-252321

(51) Int. Cl.
*H05K 1/09* (2006.01)
*H05K 1/05* (2006.01)
(Continued)

(52) U.S. Cl.
CPC ............. *H05K 1/09* (2013.01); *H05K 1/0393* (2013.01); *H05K 1/05* (2013.01); *H05K 3/022* (2013.01);
(Continued)

(58) Field of Classification Search
CPC .......... H05K 1/09; H05K 1/0393; H05K 1/05; H05K 3/022; H05K 3/06; H05K 3/38
See application file for complete search history.

(56) References Cited

U.S. PATENT DOCUMENTS

2011/0017356 A1* 1/2011 Kou .................... C21D 1/18
148/330
2011/0132643 A1* 6/2011 Hattori .................. C22F 1/08
174/254
(Continued)

FOREIGN PATENT DOCUMENTS

JP 3009383 B2 2/2000
JP 4763068 B2 8/2011
(Continued)

OTHER PUBLICATIONS

International Search Report for PCT/JP2015/084822 dated Mar. 8, 2016.
(Continued)

*Primary Examiner* — Hoa C Nguyen
*Assistant Examiner* — Amol Patel
(74) *Attorney, Agent, or Firm* — Birch, Stewart, Kolasch & Birch, LLP

(57) ABSTRACT

According to this invention, an oriented copper plate which has a highly developed cube texture and has strength and breaking elongation greater than those of a conventional material having a cube texture, a copper-clad laminate, a flexible circuit board that is excellent in terms of folding flexibility, and an electronic device are provided, and a process for producing the oriented copper plate is established. This invention relates: an oriented copper plate, which contains 0.03% by mass to 1.0% by mass of Cr, the remainder of which is composed of copper and inevitable impurities, wherein the copper plate has a <100> main orientation so that the area percentage of a <100> preferred orientation region is not less than 60.0%, the region satisfying a condition that allows each of a thickness direction of the copper plate and a specific in-plane direction of the copper plate to have an orientation difference of not more than 15° with respect to a <100> basic copper crystal axis of
(Continued)

(1)

(2)

unit lattice of copper, and wherein Cr precipitates having equivalent circle diameters of 4 nm to 52 nm are present at 300 precipitates/$\mu m^3$ to 12000 precipitates/$\mu m^3$; a copper-clad laminate and a flexible circuit board using the copper plate; and an electronic devices equipped with the flexible circuit board.

10 Claims, 5 Drawing Sheets

(51) Int. Cl.
*H05K 3/38* (2006.01)
*H05K 3/06* (2006.01)
*H05K 3/02* (2006.01)
*H05K 1/03* (2006.01)

(52) U.S. Cl.
CPC ............ *H05K 3/06* (2013.01); *H05K 3/38* (2013.01); *H05K 2201/0154* (2013.01); *H05K 2201/0317* (2013.01)

(56) References Cited

U.S. PATENT DOCUMENTS

| | | | |
|---|---|---|---|
| 2013/0008692 A1* | 1/2013 | Kimura | B21B 3/00 174/133 R |
| 2013/0167988 A1* | 7/2013 | Sakurai | C22C 9/06 148/682 |
| 2015/0122380 A1* | 5/2015 | Oishi | C22C 9/04 148/681 |

FOREIGN PATENT DOCUMENTS

| | | |
|---|---|---|
| JP | 4932974 B2 | 5/2012 |
| JP | 5446188 B2 | 3/2014 |

OTHER PUBLICATIONS

Written Opinion of the International Searching Authority for PCT/JP2015/084822 (PCT/ISA/237) dated Mar. 8, 2016.

* cited by examiner (1)

(2)

(3)

(4)

ORIENTED COPPER PLATE, COPPER-CLAD LAMINATE, FLEXIBLE CIRCUIT BOARD, AND ELECTRONIC DEVICE

TECHNICAL FIELD

The present invention relates to an oriented copper plate having high strength and high durability against thermal cycle and fatigue caused by bending or the like, a copper-clad laminate and a flexible circuit board using the oriented copper plate, and an electronic device equipped with the circuit board. Specifically, the present invention relates to an oriented copper plate having durability against bending, with which a flexible circuit board having excellent flexibility can be obtained, a copper-clad laminate and a flexible circuit board using the oriented copper plate, and an electronic device equipped with the circuit board.

BACKGROUND ART

A {100}<001> texture has a stable recrystallization orientation of relatively high purity copper, which is texture orientation that is relatively easy to develop. When copper is rolled so as to be recrystallized, cube orientation is obtained, in which the <100> orientation is aligned with the rolling direction (RD), the normal direction (ND), and the transverse direction (TD) which is orthogonal to RD and ND.

Although it is not easy to stably form a high-density cube texture, it is attempted that a high-density cube texture is industrially utilized for flexible circuit board copper foil (Patent Literature 1 and 2) and rectangular copper wire for solar cell connection (Patent Literature 3 and 4) in recent years. Such cube texture has been realized in practice in some cases. A cube texture is formed on a material, in order to improve fatigue characteristics (Patent Literature 1 and 2) and reduce Young's modulus (Patent Literature 3) and yield strength (Patent Literature 4) for softening.

In general, strain is repeatedly loaded on a metal material that constitutes such flexible circuit board copper foil or rectangular copper wire for solar cell connection. For a flexible circuit board, strain is caused by bending at a hinge portion, a slide portion, or a folding portion of a mobile phone. For a solar cell conductor, heat strain is caused by a difference in the thermal expansion coefficient between silicon and copper.

For both purposes, a case of a fatigue failure of copper that is a metal material has been reported, which would be solved by increasing fatigue strength of copper material. Patent Literature 2 teaches to utilize the fact that a cube texture is excellent in terms of the improvement of fatigue characteristics of copper foil to which a high degree of bending with a small radius of curvature is applied when, for example, copper foil is incorporated into a thin device such as a mobile phone for use. Patent Literature 2 also teaches that anisotropy of mechanical characteristics of such cube texture was utilized to create an idea of a pattern in which the stress direction is aligned with the orientation of high breaking elongation.

In order to improve fatigue characteristics of metal material, it is common to improve metal strength and enhance breaking elongation. For such a purpose, it is common to refine crystal grains. In this regard, although coarsening of grain sizes through cube texture formation is contrary to the above from the viewpoint of material texture, for example, Patent Literature 2 proves that fatigue characteristics may improve by coarsening of crystal grains. It is therefore predicted that when a copper material may have a texture including an advanced cube texture and further have enhanced strength or breaking elongation, the copper material may have enhanced excellent fatigue characteristics.

It is difficult to improve strength and breaking elongation of a material having a highly developed cube texture. As stated above, a cube texture is usually formed by using a stable recrystallization orientation of relatively high-purity copper. This suggests that the number of dislocations or grain boundaries that originally act to increase strength is small. In addition, when it is tried to improve strength by the action of enhancing solid solution or promoting precipitation of alloy elements via alloying, changes in stacking-fault energy might cause the stable recrystallization orientation to vary or precipitates to inhibit grain growth, thereby inhibiting cube texture formation. For such reasons, a copper material having an advanced cube texture is limited in terms of types or concentrations of alloy elements added. In particular, no copper alloy with a highly advanced cube orientation, which contains elements at high concentrations that would promote precipitation, has been found.

As an aside, since a copper material having a developed cube texture is produced by rolling and recrystallization upon industrial production, the <100> main orientation may be in the rolling direction. In other words, the longitudinal direction of a rectangular copper wire for solar cell connection corresponds to the <100> orientation and the stress direction of a flexible circuit board corresponds to the <100> orientation without specific intention. However, when stress is applied in the <100> orientation, the orientation results in the smallest breaking elongation, among possible orientations. Therefore, a material having an advanced cube texture is excellent in terms of fatigue characteristics while the orientation which is most likely to be used (i.e., <100>) is undesirable in terms of fatigue characteristics. For such reasons, it is desirable to improve strength and enhance breaking elongation when stress is applied to a copper material having a highly developed cube texture in the <100> direction.

CITATIONS LIST

Patent Literature

Patent Literature 1: JP Patent No. 3009383
Patent Literature 2: JP Patent No. 4763068
Patent Literature 3: JP Patent No. 5446188
Patent Literature 4: JP Patent No. 4932974

SUMMARY OF INVENTION

Technical Problem

In consideration of the above circumstances, an object of the present invention is to newly establish an oriented copper plate not only having a highly developed cube texture but also having strength and breaking elongation greater than those of a conventional material having a similar texture. Another object of the present invention is to newly establish a flexible circuit board that is excellent in terms of folding flexibility with the use of the oriented copper plate.

Solution to Problem

As a result of intensive studies in order to solve the above problems of the prior art, the present inventors found that an oriented copper plate having features of material texture regarding both advanced cube texture and Cr precipitation achieves strength and breaking elongation greater than those of a conventional copper material which has a similar cube texture density. This has led to the completion of the present invention. The subject matter of the present invention encompasses the following features.

(1) An oriented copper plate, which contains 0.03% by mass to 1.0% by mass of Cr, the remainder of which is composed of copper and inevitable impurities, wherein the copper plate has a <100> main orientation so that the area percentage of a <100> preferred orientation region is not less than 60.0%, the region satisfying a condition that allows each of a thickness direction of the copper plate and a specific in-plane direction of the copper plate to have an orientation difference of not more than 15° with respect to a <100> copper crystal axis, and wherein Cr precipitates having equivalent circle diameters of 4 nm to 52 nm are present at 300 precipitates/$\mu m^3$ to 12000 precipitates/$\mu m^3$.

(2) The oriented copper plate according to (1), which further contains one or two or more of: Mn: not more than 0.4% by mass; Al: not more than 0.4% by mass; Ti: not more than 0.2% by mass; Zr: not more than 0.2% by mass; and rare earth elements: not more than 0.4% by mass.

(3) The oriented copper plate according to (1) or (2), which further contains one or two of: P: less than 0.01% by mass; and Zn: less than 0.1% by mass.

(4) The oriented copper plate according to any one of (1) to (3), which further contains, at a total concentration of less than 0.03% by mass, one or two or more selected from the group consisting of: Ag, Sn, Pd, Ni, Fe, B, Si, Ca, V, Co, Ga, Ge, Sr, Nb, Mo, Rh, Ba, W, and Pt.

(5) A copper-clad laminate, which has an insulating layer formed on a surface of the oriented copper plate according to any one of (1) to (4).

(6) The copper-clad laminate according to (5), wherein the oriented copper plate has a thickness of 5 μm to 18 μm, and the insulating layer is composed of a resin and has a thickness of 5 μm to 75 μm.

(7) The copper-clad laminate according to (6), wherein the resin is composed of polyimide.

(8) A flexible circuit board, which has a certain wiring formed on the oriented copper plate of the copper-clad laminate according to any one of (5) to (7), which further has a bending portion at least one site of the wiring in a direction orthogonal to a specific in-plane direction of the copper plate.

(9) The flexible circuit board according to (8), wherein the bending portion is a bending portion which conducts one or two or more repetitive actions selected from the group consisting of lock seaming bending, rotary slide bending, folding bending, hinge bending, and lateral slide bending.

(10) An electronic device, which is equipped with the circuit board according to (8) or (9).

Advantageous Effects of Invention

According to the present invention, an oriented copper plate may be obtained that may have features of material texture regarding both advanced cube texture and Cr precipitation, thereby achieving strength and breaking elongation greater than those of a conventional copper material which has a similar cube texture density and having excellent folding flexibility. Such oriented copper plate may be used for a wide range of applications such as a wiring material and a circuit board material.

DESCRIPTION OF EMBODIMENTS

Figure 1A:
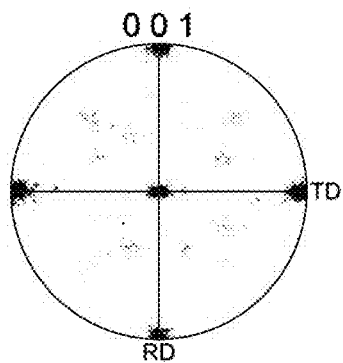
FIG. 1A is a normal pole chart obtained as a result of EBSD analysis of copper foil designated as sample 1 in Example 1.
Figure 1B:
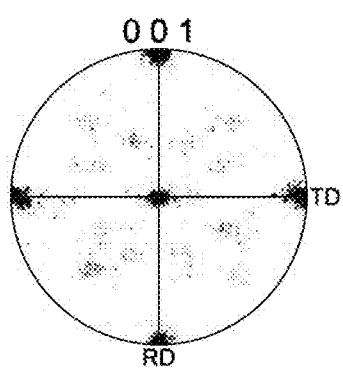
FIG. 1B is a normal pole point chart obtained as a result of EBSD analysis of copper foil designated as sample 2 in Example 1.
Figure 1C:
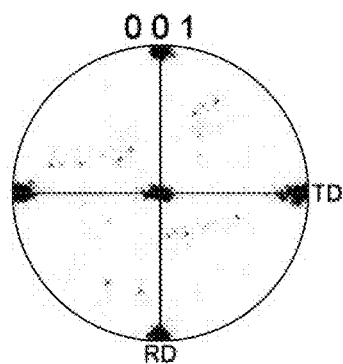
FIG. 1C is a normal pole point chart obtained as a result of EBSD analysis of copper foil designated as sample 5 in Example 1.
Figure 1D:
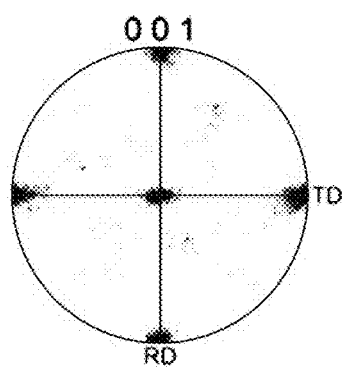
FIG. 1D is a normal pole point chart obtained as a result of EBSD analysis of copper foil designated as sample 6 in Example 1.

The present invention is described in detail below.

The oriented copper plate of the present invention is a material having an advanced cube texture formed therein, which contains Cr precipitates dispersed therein. It is a copper material having strength and breaking elongation greater than those of a conventional copper material having a similar cube texture density by promoting Cr precipitation, in which an advanced cube texture is formed. Therefore, it is excellent in terms of folding flexibility and thus can be used for a wide range of applications such as a wiring material and a circuit board material.

The cube texture density of the oriented copper plate of the present invention is characterized in that the area percentage of a preferred orientation region having an orientation difference of not more than 15° with respect to two axes orthogonal to each other, one of which is in the thickness direction of the oriented copper plate, and the other one of which is in a given in-plane direction of the oriented copper plate, is not less than 60.0%.

The crystal orientation at the center of the preferred orientation is referred to as the main orientation of texture. It can be said that the thickness direction of the oriented copper plate of the present invention corresponds to the <100> main orientation and the in-plane direction thereof also corresponds to the <100> main orientation. In other words, the copper plate of the present invention needs to have a highly oriented texture having a cube orientation, which has the <100> orientation in a plate thickness direction and the <100> main orientation orthogonal to the <100> orientation in an in-plane direction.

It is preferable to increase the density in the cube orientation, the area of a preferred orientation region forming a cube texture may be set to 100%. However, according to the present invention, the area percentage of a preferred orientation region having an orientation difference of not more than 15° with respect to two axes orthogonal to each other, one of which is in the thickness direction of the oriented copper plate, and the other one of which is in a given in-plane direction of the oriented copper plate, may be not less than 60.0%, preferably more than 70.0%, and further preferably more than 80.0%. When the area percentage of a preferred orientation region is more than 70.0%, the orientation of the remaining region tends to be an orientation similar to a twin orientation of the cube orientation, which may result in relatively smaller undesirable impact on mechanical characteristics than that of crystal grains having a different orientation. In addition, precipitation of a small amount of copper oxide is acceptable.

In this embodiment, the copper plate is composed of rolled steel. In such a case, a given in-plane direction of the oriented copper plate is a direction orthogonal to the rolling direction upon final cold rolling in the plate. In addition, the thickness direction of the oriented copper plate is a direction orthogonal to a rolled surface. Note that as plate cutting is arbitrarily determined depending on product shape, material yield, or the like, one side of the plate is not necessarily in the rolling direction as long as the oriented copper plate has a <100> main orientation in two in-plane directions orthogonal to each other.

The oriented copper plate does not have a complete plate shape. For example, it may be formed in a wire rod having an elongated tape shape via slitting or a complicated circuit shape via etching of a part of the plate surface. The normal direction of the oriented copper plate is not particularly limited and the oriented copper plate includes not only a plate material having a certain thickness but also a very thin material such as copper foil. However, in order to realize an advanced cube texture, it needs to be a copper plate having a substantial thickness of not more than 3 mm. In addition, the thickness may be appropriately determined depending on applications of the copper plate. For example, when the copper plate is used for a wiring of a flexible circuit board having a plastic substrate described below, the typical thickness is preferably 5 µm to 18 µm. When it is used for a wiring of a flexible circuit board having a ceramic substrate, the typical thickness is preferably 100 µm to 500 µm. The typical thickness of a rectangular copper wire (inter connector) used as a solar cell wiring material is preferably 100 µm to 300 µm. Note that the lower limit of the thickness is substantially 3 µm in view of limitations to rolling processing or handling in the subsequent processes.

The texture of the copper plate of the present invention can be measured and evaluated by electron back-scattered diffraction (EBSD), which is widely used as a crystal orientation analysis technique. EBSD is a technique of irradiating the surface of a sample with an electron beam in a localized manner and analyzing a diffraction pattern generated as a result of backscattering diffraction so as to determine an orientation of diffraction points using a scanning electron microscope (SEM). By two-dimensionally scanning electron beam irradiation sites arranged in a point pattern at equal intervals on a surface or a cross-section surface of a measurement sample, a two-dimensional distribution of the crystal orientation of the surface may be known, and crystal grain sizes, texture, etc., may be analyzed.

It is possible to calculate the area percentage of a <100> preferred orientation region in which an orientation difference with respect to a certain crystal axis of unit lattice falls within a certain range based on the percentage of points for which an orientation difference with respect to a certain crystal axis of unit lattice falls within a certain range with respect to the total number of points by sufficiently increasing the number of measurement points and the measurement area that represent a standard texture of the copper plate. In addition, as orientation information obtained by EBSD is three-dimensional information, orientation information of the copper plate can be evaluated based on a polished face of an arbitrary cross-sectional surface. Note that since an oriented copper plate is used in the present invention, for example, the area of a polished face of a C cross-section surface orthogonal to the plate face is limited. Therefore, according to the present invention, it is a standard way to select a large region having a size of not less than 800 µm×1600 µm for the texture of an in-plane cross-sectional surface of the copper plate which is orthogonal to the normal direction of the copper plate and conduct evaluation at intervals of not more than 4 µm within the region.

The oriented copper plate of the present invention is a copper plate containing 0.03% by mass to 1.0% by mass of Cr, the remainder of which is composed of copper and inevitable impurities. It has the aforementioned texture and a structure in which a matrix having an advanced cube texture contains 4-nm to 52-nm Cr precipitates at 300 precipitates/µm$^3$ to 12000 precipitates/µm$^3$. The precipitate size used herein refers to an equivalent circle diameter calculated based on the area of precipitates projected from one direction of the copper plate.

According to the present invention, a crystal texture is substantially defined as a highly oriented cube texture. Therefore, crystal grains that form a cube texture are coarse, and therefore a technique of increasing strength by refining crystal grains may not be employed. Although a technique of alloying for solid solution promotion or precipitation promotion may be employed, an advanced cube texture may not be formed when alloy elements are added to concentrations at which the action of enhancing solid solution or precipitation can be observed, since the stable orientation of recrystallization varies or precipitates inhibits grain growth by changes in stacking-fault energy. Further, although copper is mainly used as an electrical conducting material, when the contents of alloy elements in copper are increased, electric resistance is increased and such a copper may be inappropriate for such use.

Among alloy elements, Cr can exhibit an action of promoting precipitation even at a relatively low concentration of not less than 0.03% by mass, thereby promoting precipitation in a copper plate having an advanced cube texture. Although any alloy elements capable of promoting copper precipitation are known, only Cr has been found as an alloy element that can achieve both copper precipitation and advanced cube texture formation.

In view of precipitation promotion, it is advantageous to increase the Cr concentration in terms of strength. When the concentration increases, a highly oriented cube texture may not be formed. Therefore, in order to achieve the density of the texture of the present invention, the Cr concentration is not more than 1.0% by mass and desirably less than 0.30% by mass. When the Cr concentration is less than 0.30% by mass, an advanced texture in which the area percentage of a <100> preferred orientation region exceeds 70.0% under the presence of Cr precipitates can be formed. Thus, a copper-clad laminate and a flexible circuit board having high strength and high durability against fatigues due to thermal cycle, bending, etc., and an electronic device equipped with the circuit board may be realized.

The flexible circuit board of the present invention is mainly in the form of a complex of copper and a resin that is particularly polyimide. In the process of formation of such complex, handling of copper foil is easy when copper foil has strength in a step of consecutively forming polyimide on copper foil or attaching polyimide to copper foil. Therefore, it is desirable to realize a highly oriented cube texture by conducting cold working after Cr precipitation, feeding copper foil after precipitation promotion and work-hardening, and conducting imidization in a step of obtaining a laminate of copper and polyimide or inducing recrystallization via heat generated during heat press treatment. As this step is usually carried out at not more than 400° C. for several minutes, it is desirable to advance recrystallization with the above heat history. As the Cr concentration increases, the recrystallization temperature increases. It is therefore particularly desirable for the flexible circuit board to have a Cr content of not more than 0.20% by mass in terms of production efficiency.

The density of Cr precipitates in the copper plate of the present invention is 300 precipitates/µm$^3$ to 12000 precipitates/µm$^3$ and further preferably 2000 precipitates/µm$^3$ to 12000 precipitates/µm$^3$. In addition, although Cr precipitates of the copper plate of the present invention have sizes of 4 nm to 52 nm, precipitates having sizes of less than 4 nm or more than 52 nm can statistically exist. However, most of precipitates fall within the above range and particularly a range of 8 nm to 40 nm. Precipitates having the grains sizes of the present invention have an action of inhibiting motion of dislocations, which most contributes to precipitation promotion.

In general, although it is desirable for elements other than Cr not to inhibit cube texture formation, they may be contained as inevitable impurities. The acceptable range of each element differs. The term "inevitable impurities" refers to elements contained as impurities in raw material copper or raw material Cr or elements brought by a crucible or an environmental gas. Inevitable impurities are described below, which are likely to be contained in electrolytic copper, oxygen-free copper, tough pitch copper, or scrap copper that is very likely to be used as a raw material of the present invention.

For example, elements such as Mn, Al, Ti, Zr, and rare earth elements may be contained up to certain concentrations because they have a relatively weak action of inhibiting cube texture formation. The acceptable concentrations of rare earth elements, Mn, and Al are up to 0.4% by mass, and those of Ti and Zr are up to 0.2% by mass. Although these elements have an action of promoting solid solution which is weaker than an action of promoting Cr precipitation, small amounts of rare earth elements, Al, Ti, etc., might bind to elements such as O and S contained as inevitable impurities, thereby suppressing an action of inhibiting cube texture formation in some cases. When an alloy is formed with Cr, using these elements with an expectation of their deoxidation or desulfurization action upon dissolution, it is desirable for most of the elements to be brought outside of the system in the form of oxide or sulfide upon dissolution so that they do not remain in the material. However, some of them remain in the copper plate in the form of a compound or a solid solution element. The amounts of solid solution elements are desirably very small. Although Mn is solid-soluble at not more than 0.4% by mass and has a weak promotion action, as it has an action of improving breaking elongation, it is actively used in some cases. As the present invention is often used mainly in an energized state, the amount of Mn is desirably small in view of inhibition of electric resistance. For example, in order to satisfy the international annealed copper standard (IACS) which is not less than 95%, the Mn content needs to be not more than 0.04% by mass. IACS is a standard denoting electroconductivity when a standard value of resistance of pure copper of 1.7241×10$^{-8}$ Ωm is determined to be 100%.

Inevitable impurities include elements that may be limited in order to achieve the objectives of the present invention. Although the concentrations of Ag, Sn, Pd, Ni, Fe, B, Si, Ca, V, Co, Ga, Ge, Sr, Nb, Mo, Rh, Ba, W, and Pt would vary depending on materials used, the total concentration of these elements is desirably less than 0.03% by mass. As Ni and Fe have strong ability to increase electric resistance, the total content thereof need to be adjusted to not more than 0.025% by mass in order to achieve the International Annealed Copper Standard (IACS) which is not less than 95%. Although oxygen (O) is contained as an impurity in oxygen-free copper or tough pitch copper as well, its ability to inhibit cube texture formation is relatively small within a range of up to 0.05% by mass, which is the oxygen concentration in tough pitch copper.

In addition, P has the deoxidation action and improves strength while inhibiting cube texture formation. The concentration of P in a copper plate specified according to the present invention needs to be less than 0.01% by mass. In addition, although Zn has low ability to increase electric resistance, it inhibits cube texture formation as in the case of P. The concentration of Zn in a copper plate specified according to the present invention needs to be less than 0.1% by mass. In other words, when the content of P in a copper plate in which Cr precipitation has taken place as specified in the present invention is not less than 0.01% by mass, a copper plate in which the area percentage of the <100> preferred orientation region is not less than 60.0% may not be obtained. In addition, when the content of Zn in the copper plate is not less than 0.1% by mass, a copper plate in which the area percentage of the <100> preferred orientation region is not less than 60.0% may not be obtained. In order to achieve a more advanced orientation, the contents of such elements need to be limited. When phosphorus deoxidized copper is used as a raw material for pure copper, caution need to be exercised.

The copper concentration in the remainder except Cr in the present invention is desirably not less than 98% by mass. Assuming that copper contains no impurities other than Cr at 0.03% by mass, the upper limit is 99.97% by mass.

The size and density of Cr precipitates described above can be examined using a transmission electron microscope (TEM). A transmission image of a sample with a uniform film thickness of, for example, 150 nm, which would vary depending on accelerating voltage of TEM, can be viewed. Unlike cross-section observation, a projection image of precipitates can be observed as a contrast image, and therefore the number of precipitates in a certain volume may be counted. In addition, the equivalent circle diameters of precipitates may be calculated based on the projection area obtained by image analysis of the contrast image.

Characteristics of the oriented copper plate of the present invention in terms of material structure, a relationship of mechanical characteristics, and embodiments of applied use of the present invention are described below.

The oriented copper plate of the present invention has a highly oriented {100}<001> texture (cube texture) and thus it has resistance against metal fatigue. Further, as it contains fine Cr precipitates, it is characterized by high strength.

In general, material structure influences fatigue characteristics of material. In a case of a fine structure, strength and breaking elongation improve while the grain boundary becomes a face where dislocations are concentrated. In addition, due to mechanical anisotropy of each crystal grain based on the crystal orientation, when thermal stress or mechanical stress such as folding or tension is applied, it causes localized deformation, resulting in microscopic stress concentration. This aggravates fatigue characteristics. It is therefore desirable for the copper plate to include no grain boundary and to have an advanced orientation and three basic copper crystal axes, which are aligned. The cube texture of the present invention is formed for such purposes.

The cube texture of the present invention is a recrystallization texture, which is industrially formed using rolling and recrystallization. It is therefore difficult to impart strength thereto. Nevertheless, through promotion of Cr precipitation, high strength is achieved while maintaining an advanced cube texture.

Therefore, the oriented copper plate of the present invention is a material having enhanced tolerability to metal fatigue and a relatively low alloy concentration. It is useful as, for example, a copper-clad laminate material having a plastic or ceramic substrate for a solar cell wiring material (e.g., a solar cell inter connector). A representative example of a member produced from a copper-clad laminate material having a plastic substrate is a flexible circuit board. It is often used in a bent state by using its flexibility.

A fatigue failure of copper often occurs in a solar cell wiring material or a flexible circuit board in breakdown mode. The copper plate of the present invention is very useful for such applications. In particular, a flexible circuit board is used in a folded state in a thin device such as a mobile phone. As a result of thinning, the curvature of bending becomes very small. The flexible circuit board has been increasingly used in a folded state for "lock seaming" when mounted. Therefore, it is very useful to apply the present invention for such purposes.

Embodiments of the flexible circuit board of the present invention are described below.

A flexible circuit board is formed by binding a copper plate to plastic used for an insulating layer, thereby creating a circuit pattern on the copper plate. The copper-clad laminate in which an insulating layer is formed on a copper plate according to the present invention can be used for such flexible circuit board. Typically, the thickness of the copper plate is 5 µm to 18 µm and the thickness of the insulating layer is 5 µm to 75 µm. The thickness of the insulating layer can be suitably determined depending on applications, shape, etc., of the flexible circuit board. However, in view of flexibility, it is preferably within the above range, more preferably 9 µm to 50 µm, and most preferably 10 µm to 30 µm. When the thickness of the insulating layer is below 5 µm, insulation reliability might deteriorate. On the other hand, when it is above 75 µm, the thickness of the entire circuit board might excessively increase when a flexible circuit board is mounted on a small apparatus or the like, which may result in reduction of flexibility.

The insulating layer for the copper-clad laminate of the flexible circuit board of the present invention is preferably formed using a resin. Type of a resin that forms the insulating layer is not particularly limited. However, examples thereof include polyimide, polyamide, polyester, liquid crystal polymer, polyphenylene sulfide, and polyether ether ketone. In particular, polyimide and liquid crystal polymer are particularly preferable because a circuit board containing polyimide or liquid crystal polymer has favorable flexibility and excellent thermostability.

When the flexible circuit board is mounted on a small apparatus or the like, a cover material described below is formed on a wiring formed with a copper plate such as copper foil in many cases. In such a case, it is desirable to design a configuration of a resin that forms the cover material and the insulating layer in consideration of a balance of stress applied to the wiring. According to the present inventors' findings, given that the modulus of elasticity in tension of a polyimide resin forming the insulating layer is 4 to 6 GPa at 25° C. and thickness is 14 to 17 µm, a cover material to be used is desirably configured to have two layers, which are an adhesion layer composed of a thermosetting resin having a thickness of 8 to 17 µm and a polyimide layer having a thickness of 7 to 13 µm, and a total modulus of elasticity in tension of the adhesion layer and the polyimide layer of 2 to 4 GPa. In addition, given that modulus of elasticity in tension of a polyimide forming the insulating layer at 25° C. is 6 to 8 GPa and the thickness is 12 to 15 µm, a cover material to be used is desirably configured to have two layers, which are an adhesion layer composed of a thermosetting resin having a thickness of 8 to 17 µm and a polyimide layer having a thickness of 7 to 13 µm, and a total modulus of elasticity in tension of the adhesion layer and the polyimide layer of 2 to 4 GPa.

In addition, when a ceramic substrate is used for the copper-clad laminate, typical examples of ceramic that constitutes a ceramic substrate are alumina, alumina zirconia, aluminum nitride, and silicon nitride, and the thickness of the ceramic substrate is often 0.2 mm to 0.5 mm. The thickness of a copper plate often falls within a similar range. In many cases, a copper plate is bonded to both sides of a ceramic substrate, a circuit pattern is formed on one side thereof, and the other side is used as a plain side for heat dissipation. The bond may be formed by direct bonding or using a metal wax.

Processes for producing the oriented copper plate, copper-clad laminate, and flexible circuit board of the present invention are described below.

Requirements for the process for producing the oriented copper plate of the present invention are that a copper alloy containing Cr at 0.03% by mass to 1.0% by mass is treated by cold working at an area reduction rate of not less than 90% and then aging heat treatment at 400° C. to 700° C. for not less than 30 minutes.

A variety of methods for uniform dissolution of Cr, such as continuous casting, arc-melting, and high frequency melting, can be employed for alloy dissolution. The dissolution temperature is usually 1100° C. to 1200° C. When the speed of cooling after dissolution is slow, it may cause Cr precipitation, which sometimes results in growth of grains to sizes greater than the sizes specified in the present invention. In such a case, solution treatment needs to be conducted. In view of the solid solution limit of Cr, the solution treatment temperature is not less than 800° C. and desirably 950° C. to 1080° C.

Cr precipitation treatment may be conducted at any stage of the process. It may be conducted after dissolution, during rolling, or after the final ND thickness is realized. The temperature for Cr precipitation is 400° C. to 700° C. When the temperature is excessively low, a sufficient amount of precipitates may not be obtained within a period of industrially practical time. On the other hand, when the temperature is excessively high, as the solid solubility limit increases, the amount of precipitates decreases and precipitates are coarsened, resulting in reduction of the pinning effects for inhibiting motion of dislocations. The aging time for precipitation is at least 30 minutes, which however may depend on the temperature. The precipitation treatment may be conducted for the purpose of middle annealing or final annealing heat treatment for cube texture formation.

The process of producing an oriented copper plate is not limited while an oriented copper plate can be obtained by special rolling processing and heat treatment under controlled conditions. For example, an oriented copper plate can be obtained by conducting rolling such as asymmetric rolling or cross rolling to introduce a shear strain in various directions, inducing primary recrystallization, and conducting not less than 90% cold rolling under conditions that do not cause dynamic recrystallization so as to prepare a plate having a desired thickness and containing a uniform lamellar structure extending in parallel with the rolling direction, following which recrystallization is induced by heating. In such a case, the specific in-plane direction of copper plate is identical to the rolling direction. Since it difficult to increase the degree of integration of cube texture when the final ND thickness increases, it is preferable to select and strictly control conditions for the process.

The recrystallization temperature needs to fall within a temperature range of 200° C. to 700° C., although it may vary depending on concentrations of Cr or other impurity elements. Although the recrystallization heat treatment time for cube texture formation is not necessarily as long as the aging heat treatment time for precipitation, recrystallization heat treatment may be conducted for the purpose of aging heat treatment.

When a ceramic substrate is used for copper-clad laminate, examples of a method for bonding a ceramic substrate and a copper plate include an active-metal method in which a metal wax material such as a Ag—Cu alloy having a melting point lower than that of copper containing an active metal such as Ti or Zr is inserted between a ceramic substrate and a copper plate for liquid-phase bonding, and a direct bonding method in which a ceramic substrate and a copper plate are disposed to face each other so as to be brought into contact with each other so that a Cu—$Cu_2O$ eutectic crystal is formed in the inter face at a temperature of not less than 1050° C., followed by cooling for bonding, in addition to a method in which a Mo—Mn powder is inserted into the interface between ceramic and a copper plate and sintering is conducted in a reducing atmosphere at about 1500° C. In each method, as the processing temperature exceeds 700° C., aging precipitation heat treatment of a copper plate needs to be conducted after bonding.

Examples of a process for producing a copper-clad laminate using a plastic as a substrate include a cast process, a hot press process, and a lamination process. As the temperature at which an insulating layer composed of a resin is formed is about 400° C. at a maximum, it is preferable to treat a copper plate by aging heat treatment for Cr precipitation before boding the copper plate with a resin. Recrystallization heat treatment for cube texture formation may be conducted after copper-clad laminate formation. A copper plate used for a copper-clad laminate having a plastic substrate is in a state of thin foil. In terms of handling upon formation of the insulating layer, the copper plate is desirably hard. Accordingly, aging heat treatment for Cr precipitation may be conducted before cold working of copper and to conduct heat treatment for cube texture formation at the temperature for insulating layer formation. In this case, as it is preferable to induce recrystallization at 400° C., the Cr concentration is desirably less than 0.20% by mass.

When the insulating layer is composed of polyimide, thermoplastic polyimide may be applied or added to a polyimide film, and a copper plate may be heat laminated (lamination process). Examples of a polyamide film used in a lamination process include "Kapton (registered trademark)" (Du Pont-Toray Co., Ltd.), "Apical" (Kanegafuchi Chemical Industry Co., Ltd.), and "Upilex (registered trademark)" (Ube Industries, Ltd.). When a polyimide film and a copper plate are bonded under heating and pressure, it is preferable to add a thermoplastic polyimide resin having thermoplasticity. When a resin layer is formed by bonding a polyimide film under heating and pressure by such lamination process, the temperature for bonding under heating and pressure is preferably 280° C. to 400° C.

From the viewpoint of the ease of controlling resin layer thickness, folding characteristics, etc., a polyimide precursor solution may be applied to a copper plate (also referred to as a polyamide acid solution), following which the solution is dried and cured such that an insulating layer is formed (i.e., a cast process). In such cast process, the temperature of heating treatment for forming an insulating layer composed of a resin by imidizing a polyimide precursor solution is preferably 280° C. to 400° C.

In addition, the insulating layer may be formed by layering a plurality of resins. For example, two or more types of polyimides having different linear expansion coefficients may be layered. In such a case, from the viewpoint of ensuring thermostability and flexibility, it is desirable that the insulating layer may substantially consist of polyimides without using an epoxy resin or the like as an adhesive. In any case where the insulating layer is formed with a single polyimide or a plurality of polyimides, the modulus of elasticity in tension of the resin constituting the insulating layer is preferably 4 to 10 GPa and more preferably 5 to 8 GPa.

It is preferable for the copper-clad laminate of the present invention to have a linear expansion coefficient of a resin that forms an insulating layer of 10 to 30 ppm/° C. When the insulating layer is composed of a plurality of resins, the linear expansion coefficient of the entire insulating layer may be adjusted to fall within the above range. In order to satisfy such a condition, the linear expansion coefficient of an insulating layer may be brought to 10 to 30 ppm/° C. by adjusting the thickness ratio of a low linear expansion polyimide layer and a high linear expansion polyimide layer for example, the insulating layer composed of the low linear expansion polyimide layer having a linear expansion coefficient of not more than 25 ppm/° C. and preferably 5 to 20 ppm/° C. and the high linear expansion polyimide layer having a linear expansion coefficient of not less than 26 ppm/° C. and preferably 30 to 80 ppm/° C. The thickness ratio of a low linear expansion polyimide layer and a high linear expansion polyimide layer is preferably 70:30 to 95:5. In addition, it is preferable to provide a low linear expansion polyimide layer and a high linear expansion polyimide layer so that low linear expansion polyimide forms a main rein layer of the insulating layer and high linear expansion polyimide comes into contact with the copper plate. Note that the linear expansion coefficient can be calculated based on the mean linear expansion coefficient when a polyimide in which a sufficient imidization reaction has been completed is used as a sample and the temperature is increased to 250° C. using a thermomechanical analyzer (TMA) and then decreased at a rate of 10° C./minute to 240° C. to 100° C.

The width, shape, pattern, etc., of a substrate wiring are not particularly limited regardless whether the insulating layer of the copper-clad laminate is formed with ceramic or plastic. The substrate wiring may be designed appropriately in accordance with the usage of a circuit board, an electronic device to which a circuit board is mounted, etc. In general, a circuit is formed by chemical etching.

A flexible circuit board obtained from a copper-clad laminate according to the present invention is provided with a wiring formed with an insulating layer and an oriented copper plate, either one of which has a bending portion for use. In other words, the flexible circuit board is used for a wide range of applications for various electronic/electric equipment such as a movable unit in a hard disk, a hinge part or a slidably movable part of a mobile phone, a printer head unit, an optical pickup unit, and a movable unit of a laptop computer. For such applications, the circuit board itself is folded, twisted, or deformed depending on an operation of the equipment on which the circuit board is mounted such that a bending portion is formed at an arbitrary site. In particular, as the copper plate of the present invention is used for the flexible circuit board of the present invention, the bending portion has a construction excellent in terms of bending durability. Therefore, the flexible circuit board of the present invention is suitable when folding is conducted frequently by repeating an action of rotary slide bending, folding bending, hinge bending, slidable bending, or the like, or when in order to respond to downsizing of equipment on which the circuit board is mounted, the radius of curvature is 0.38 to 2.0 mm for folding bending, 1.25 to 2.0 mm for rotary slide bending, 3.0 to 5.0 mm for hinge bending, and 0.3 to 2.0 mm for slidable bending under stringent use conditions. The flexible circuit board of the present invention has remarkably advantageous effects when the flexible circuit board is used for sliding in which flexibility is highly demanded at a narrow gap of 0.3 to 1 mm.

Further, even in the case of lock seaming, in which folding is conducted further intensively in a manner conducted for mounting of smartphones while the number of times of bending is small, as a copper plate having an advanced orientation and high strength is used for the flexible circuit board of the present invention, the flexible circuit board has excellent durability and reliability even if a bending portion is formed on at least one part of a wiring so that the bending direction is orthogonal to a certain in-plane orientation of copper plate.

As explained above, the oriented copper plate of the present invention has an advanced orientation and contains alloy components specified herein so that precipitation of the components prevents metal fatigue, and it also has excellent durability against stress and strain.

In particular, a flexible circuit board, which is obtained by forming a copper-clad laminate using the above oriented copper plate and performing etching on a copper foil thereof by a known process for wire formation, has strength against repetition of folding at a small radius of curvature, which is excellent in terms of flexibility. Therefore, the flexible circuit board can be designed without limitations such as consideration of the wiring shape at the bending portion, etc.

EXAMPLES

The present invention is described in more detail based on the Examples and Comparative Examples below. These are examples of the present invention, and therefore the present invention is not limited thereto.

Example 1

First of all, in order to demonstrate the ability to promote Cr precipitation of the oriented copper plate of the present invention, the effects of the present invention were examined using high-purity copper as a raw material to reduce impacts of other components.

Copper with a purity of not less than 99.9999% by mass and Cr with a purity of not less than 99.99% were used as raw materials. These were weighed in certain amounts, dissolved in a vacuum of not more than $10^{-2}$ Pa using a high-purity graphite crucible, and casted in a high-purity graphite mold which was cooled via water-cooled copper hearth. The ingot had a size of 30 mm×55 mm×12 mm. This was hot rolled at 700° C. so that a plate with a thickness of 1.5 mm was prepared. Hot rolling was conducted alternately in the 30-mm length direction and the 55-mm length direction by changing the hot rolling direction by 90° until the number of passages of the ingot reached 7. Middle annealing of a hot-rolled sheet with a thickness of 1.5 mm was conducted in nitrogen at 300° C. for 2 hours. This copper plate material was cold rolled to result in a thickness of 0.4 mm. Slitting was conducted to adjust the width to 40 mm. Then, cold rolling was conducted using a tension roller so that the final ND thickness was adjusted to 12 μm. The oriented copper plate having the final ND thickness by rolling was analyzed for the Cr concentration by ICP spectrometry.

Twelve types of copper foil samples were prepared in the above manner. Their Cr concentrations were 0% by mass (samples 1 and 2), 0.019% by mass (sample 3), 0.03% by mass (sample 4), 0.1% by mass (samples 4 to 8), 0.19% by mass (sample 9), 0.29% by mass (sample 10), 1.0% by mass (sample 11), and 1.1% by mass (sample 12). The Cr concentrations of samples 3 to 12 were analytical values. In addition, samples 1 and 2 were prepared in the above manner except that Cr was not added. As high-purity copper was used as the main element and the high-purity graphite crucible was used in this Example, the concentrations of elements other than Cu and Cr were at or below 0.0001% by mass, which was the detection limit.

These samples were annealed in a nitrogen atmosphere at 200° C. to 710° C. for 1 hour in order to examine their material textures and mechanical properties. The material textures were evaluated by EBSD combined with field-emission scanning electron microscopy (FE-SEM) and precipitates were evaluated by field-emission transmission electron microscopy (FE-TEM). In addition, tensile test was conducted for mechanical characteristics.

Textures of the oriented copper plates were obtained by performing mechanical and chemical polishing on the rolling surface of each oriented copper plate using colloidal silica and conducting orientation analysis using an EBSD system. The systems used herein were FE-SEM (ZEISS Ultra 55), an EBSD system (TSL), and software (OIM Analysis 5.2). The measurement area was of 800 μm×1600 μm. The accelerating voltage upon measurement was set to 20 kV and the measurement step interval was set to 4 μm (measurement was conducted so that measurement points formed a triangular lattice, the distance between measurement points was 4 μm, and the total measurement score was 92,631 points in the above region in this Example). In this Example, the density of the cube texture of the present invention, i.e., the <100> preferred orientation region, may be expressed as a percentage of the measurement points at which the <100> orientation has a difference of not more than 15° with respect to both the thickness direction of the copper plate and the rolling direction of the copper plate (i.e., the specific in-plane direction of the copper plate) with respect to the total measurement points. Two different visual fields were examined for each type of sample and the percentage was rounded to the nearest tenth to obtain the number of measurement points. Regarding copper foil samples 1 to 11, since crystal grains forming the <100> preferred orientation region were large and some of them were greater than the above measured area, it difficult to specify the grain size as in the case of sample 13 in Example 2 described below. The mean grain size (area mean diameter) of sample 12 having the smallest crystal grain size among copper foil samples 1 to 12 was determined to be 10

µm via calculation by EBSD software without including Σ3 grain boundary. Accordingly, the mean grain sizes of copper foil samples 1 to 11 were found to be greater than 10 µm.

Each of the copper plates was thinned by electropolishing and precipitates in each copper plate were assessed using Hitachi FE-SEM (HF-2000). The thickness of the measured area of each sample was 0.15 µm. Measurement was carried out at an accelerating voltage of 200 kV. The orientation of copper matrix was confirmed by electron diffraction. Composition analysis using electron diffraction and EDS analysis systems was employed for identification of the precipitates. The size and density of each precipitate were determined by processing the resulting image, determining a projected area for the contrast image of each obtained precipitate, and calculating the equivalent circle diameter.

A specimen having a length of 150 mm and a width of 10 mm was cut out from each copper plate to conduct tensile test at a gauge distance of 100 mm and a tensile speed of 10 mm/minutes in parallel to the rolling direction. A stress-strain diagram was created based on the results obtained in tensile test for evaluation in terms of 0.2% proof stress, strength, and breaking elongation. Stress is a value obtained by dividing a load on the load cell by the cross-sectional area of a copper plate before tensile test. Strain corresponds to displacement of a crosshead of a tensile tester with respect to the gauge distance, which is expressed as a percentage.

Figure 2:
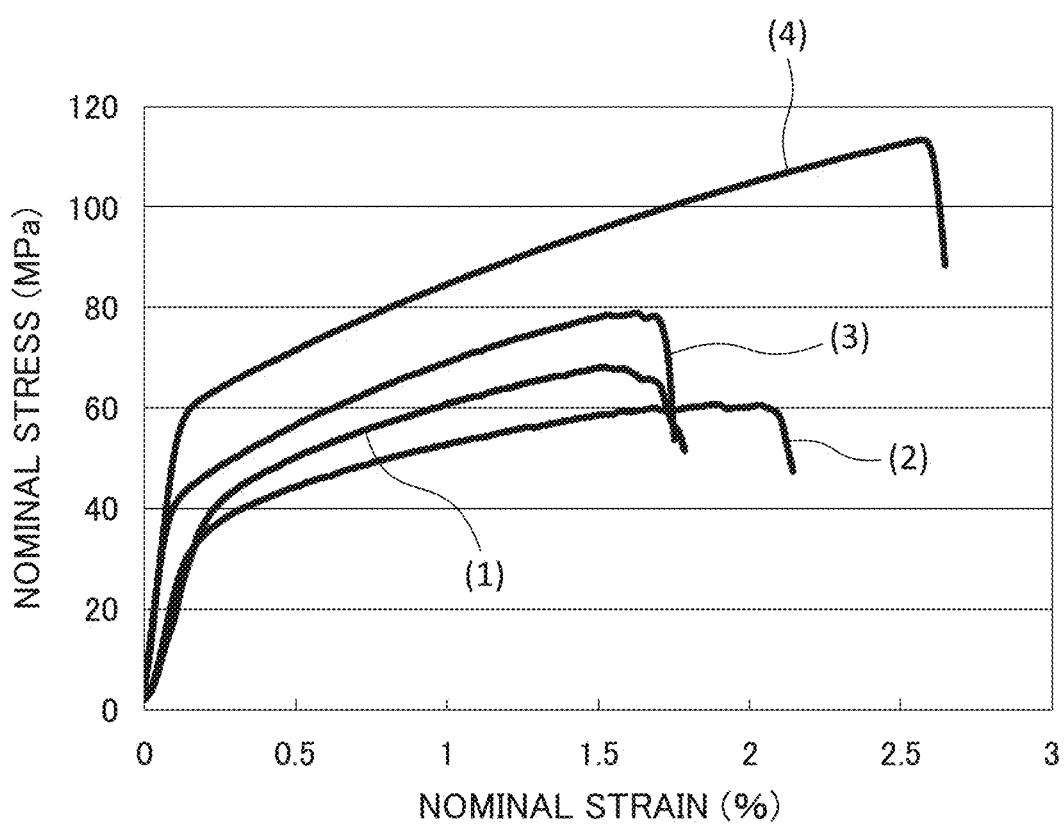
FIG. 2 shows stress-strain curves obtained as a result of tensile test of the samples shown in FIG. 1 according to Example 1.

Table 1 summarizes the results. In addition, FIGS. 1A to 1D are normal pole point charts and FIG. 2 is a stress-strain diagram for EBSD evaluation of the representative samples. Note that (1), (2), (3), and (4) indicate the results for samples 1, 2, 5, and 6, respectively, in FIGS. 1A to 1D and FIG. 2.

[Table 1]

which was substantially the same for each sample. Table 1 lists percentages of the <100> preferred orientation region for the other samples.

FIG. 2 depicts stress-strain curves obtained as a result of tensile test of samples of FIGS. 1A to 1D. Although the textures of the four samples were substantially the same, the samples were significantly different from each other in terms of 0.2% proof stress, strength, and breaking elongation. In addition, the results for the other samples regarding 0.2% proof stress, strength, and breaking elongation are listed in Table 1. Sample 2 free from Cr had the smallest 0.2% proof stress and strength, the sample being annealed at 390° C. for 1 hour, since high-purity copper was used, and recrystallization heat treatment was conducted at high temperatures, thereby causing the concentration of defects such as dislocations or holes to decrease.

Figure 3:
FIG. 3 is a light field image of sample 6 produced in Example 1, which is captured using a transmission electron microscope.

Although Sample 5 was a sample having a Cr concentration of 0.1% by mass which was obtained by conducting heat treatment at 390° C. for 1 hour as in the case of sample 2, a slope of a line, 0.2% proof stress, and strength of sample 5 were greater than those of samples 1 and 2 in the low-strain area of the stress-strain curve, since Cr has the action of promoting precipitation. Although Sample 6 was a sample having a Cr concentration of 0.1% by mass, which was obtained by conducting heat treatment at 590° C. for 1 hour as in the case of sample 5, strength was further improved, although the annealing temperature increased and the concentration of defects such as dislocations or holes decreased. FIG. 3 is a light field TEM image of sample 6, in which fine granular contrasts were observed. As a result of electron diffraction and EDS analysis, it was found that precipitation of fine Cr particles took place in a matrix in which the <100>

TABLE 1

| Sample No. | Cr concentration (% by mass) | Annealing temperature (° C.) | Percentage of <100> preferred orientation region (%) | Cr precipitate density (precipitates/µm³) | Cr precipitate mean grain size (nm) | 0.2% proof stress (MPa) | Strength (MPa) | Breaking elongation (%) | Remarks |
|---|---|---|---|---|---|---|---|---|---|
| 1 | 0 | 200 | 99.4 | 0 | — | 41.0 | 68.1 | 1.5 | Comparative Example (1) |
| 2 | 0 | 390 | 98.8 | 0 | — | 36.9 | 60.5 | 2.1 | Comparative Example (2) |
| 3 | 0.019 | 590 | 99.1 | 249 | 18.4 | 43.2 | 67.8 | 1.9 | Comparative Example |
| 4 | 0.03 | 590 | 98.9 | 301 | 16.9 | 51.8 | 90.0 | 2.1 | Example |
| 5 | 0.10 | 390 | 99.2 | 1013 | 5.6 | 43.1 | 79.5 | 1.6 | Example (3) |
| 6 | 0.10 | 590 | 99.2 | 2287 | 9.8 | 61.0 | 115.1 | 2.5 | Example (4) |
| 7 | 0.10 | 690 | 99.4 | 671 | 19.7 | 41.2 | 76.7 | 2.3 | Example |
| 8 | 0.10 | 710 | 99.3 | 286 | 29.8 | 38.0 | 72.1 | 2.1 | Comparative Example |
| 9 | 0.19 | 690 | 80.2 | 4013 | 31.6 | 95.6 | 158.3 | 3.8 | Example |
| 10 | 0.29 | 690 | 70.1 | 6921 | 33.7 | 98.6 | 171.8 | 4.1 | Example |
| 11 | 1.0 | 690 | 60.3 | 11963 | 38.2 | 100.3 | 250.5 | 6.9 | Example |
| 12 | 1.1 | 690 | 55.3 | 13598 | 38.9 | 110.5 | 261.3 | 7.5 | Comparative Example |

FIGS. 1A to 1D are normal pole point charts of EBSD analysis results for copper plate samples 1, 2, 5, and 6. Each point denotes a measurement point in the normal pole point charts. The <100> orientation is observed in the rolling direction, the normal direction, and the transverse direction for each sample, meaning that a strong recrystallization cube texture was formed in each sample. The percentage of the <100> preferred orientation region calculated from measurement points when the <100> orientation had a difference of not less than 15° with respect to both the foil rolling direction and the foil thickness direction was about 99%, orientation was observed in the rolling direction and the thickness direction of the copper plate. In addition, linear contrasts observed in the visual field represent dislocations, which are much less than those observed for usual copper material.

In other words, final anneal heat treatment caused recrystallization from the processed structure to the cube texture and aging precipitation of Cr to simultaneously proceed in a well-balanced manner.

Figure 4:
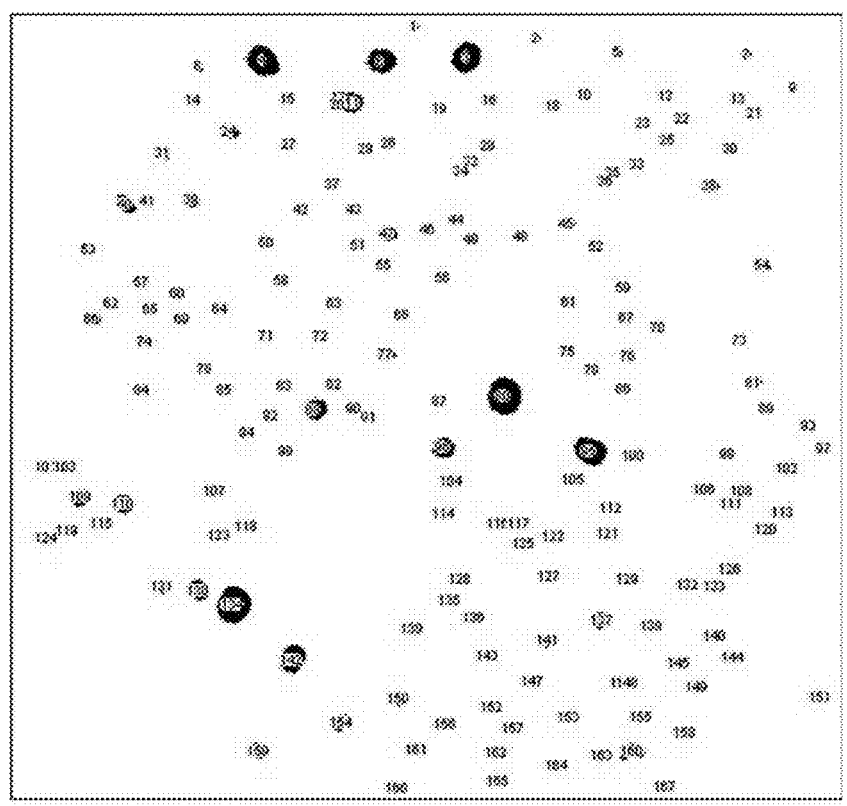
FIG. 4 is a binarized image of contrast between matrix and Cr precipitates in the light field image of FIG. 3, in which the precipitates are numbered.

FIG. 4 is a binarized image of contrast between matrix and Cr precipitates in a visual field of the light field image (0.697 µm×0.697 µm) of FIG. 3, in which the precipitates are numbered. The number of precipitates and the area of each precipitate were determined to calculate density and mean particle size. The thickness of the TEM sample was 0.15 µm and the image was a transmission image, which means that the number of Cr precipitates present in the region with a size of 0.697×0.697×0.15 µm$^3$ was counted. As a result, the density of Cr precipitates in sample 6 was found to be 2287 precipitates/µm$^3$. The precipitate size was distributed from 4 nm to 36 nm and the mean diameter was 9.8 nm.

Cr precipitates in the other samples were evaluated in a similar manner. The differences in 0.2% proof stress, strength, and breaking elongation between sample 5 and sample 6 were mainly differences in the action of promoting Cr precipitation. The values for sample 5 were smaller than those of sample 6, since the density of Cr precipitates of sample 5 is smaller than that of sample 6. The density of Cr precipitates in each sample listed in Table 1 represents the number of Cr precipitates having equivalent circle diameters of not less than 4 nm to 52 nm per unit volume. In addition, although sample 12 has very high levels of 0.2% proof stress, strength, and breaking elongation, as the area percentage in the <100> preferred orientation region is less than 60.0%, sample 12 has poor fatigue characteristics.

The results of Table 1 suggest that the concentration at which formation of a cube texture with a percentage of the <100> preferred orientation region of not less than 60.0% and promotion of Cr precipitation can be achieved is not less than 1.0% by mass. In addition, the concentration at which formation of a cube texture with a percentage of the <100> preferred orientation region of not less than 70.0% and promotion of Cr precipitation could be achieved is less than 0.30% by mass. Further, the concentration at which formation of a cube texture with a percentage of the <100> preferred orientation region of not less than 80.0% and promotion of Cr precipitation could be achieved is less than 0.20% by mass. Furthermore, most of Cr particles having concentrations at which formation of a cube texture with a percentage of the <100> preferred orientation region of not less than 60.0% and promotion of Cr precipitation could be achieved were found to have diameters of 4 to 52 nm. The precipitate density at which formation of a cube texture with a percentage of the <100> preferred orientation region of not less than 60.0% and promotion of Cr precipitation can be achieved was estimated as 12000 precipitates/µm$^3$. The lower limit of the Cr concentration within a range that is effective for the present invention is obviously determined to be 0.03% by mass at which 0.2% proof stress, strength, and breaking elongation can be improved using 6N copper foil.

Example 2

Flexible circuit boards were produced using copper foil samples 1 to 12 (oriented copper plates) prepared in Example 1 and folding (lock seaming) test was conducted. In addition, copper foil obtained by heat treating commercially available electrolytic copper foil in nitrogen at 390° C. for 1 hour was added as sample 13 for comparison.

The purity of the copper plate designated as sample 13 was not less than 99%. As a result of tensile test conducted under conditions the same as those in Example, 0.2% proof stress, strength, and breaking elongation were 115 MPa, 159 MPa, and 5.8%, which were relatively high. In addition, polishing was performed according to the sample preparation method in Example 1. Then, the measurement system used in Example 1 was used to conduct texture analysis of a visual field of a measurement region of 80 µm×160 µm at an accelerating voltage of 20 kV and a measurement step interval of 0.4 µm upon measurement. As a result, this sample was a polycrystal and having a grain size (area mean diameter) of about 2 µm without Σ3 grain boundary. In addition, the percentage of the <100> preferred orientation region was calculated in the manner described in Example 1 and it was 6.8%.

The following two types of polyamide acid solutions were prepared as precursors of polyimide that forms an insulating layer of flexible circuit boards for test in this Example.

Synthetic Example 1

N,N-dimethylacetamide was placed in a reaction container capable of nitrogen introduction, which was equipped with thermocouples and a stirrer. 2,2-bis [4-(4-aminophenoxy)phenyl]propane (BAPP) was added to the reaction container and dissolved therein during stirring. Next, pyromellitic dianhydride (PMDA) was added thereto so that the total amount of monomers introduced became 15% by mass. Thereafter, stirring was continued for 3 hours. Thus, a resin solution of polyamide acid a was obtained. The solution viscosity of the resin solution of polyamide acid a was 3,000 cps.

Synthetic Example 2

N,N-dimethylacetamide was placed in a reaction container capable of nitrogen introduction, which was equipped with thermocouples and a stirrer. 2,2'-dimethyl-4,4'-diaminobiphenyl (m-TB) was added to the reaction container. Next, 3,3',4,4'-biphenyl-tetracarboxylic acid dianhydride (BPDA) and pyromellitic dianhydride (PMDA) were added thereto so that the total amount of monomers introduced became 15% by mass and the molar ratio of the acid anhydrides (BPDA:PMDA) became 20:80. Thereafter, stirring was continued for 3 hours. Thus, a resin solution of polyamide acid b was obtained. The solution viscosity of the resin solution of polyamide acid b was 20,000 cps.

Next, a process for forming a copper-clad laminate that is a complex of a copper plate and a polyimide is described below.

The solution of polyamide acid a obtained in Synthetic Example 1 was applied to one surface of each of the copper plate samples 1 to 12 prepared in the above and dried (so that thermoplastic polyimide with a film thickness of 2 µm was formed after curing). The solution of polyamide acid b obtained in Synthetic Example 2 was applied to each coated surface and dried (so that low thermally expandable polyimide with a film thickness of 8 µm was formed after curing). The solution of polyamide acid a was further applied and dried (so that thermoplastic polyimide with a film thickness of 2 µm was formed after curing), followed by heating under conditions that applied heat at 280° C. for an integration time of not less than 5 minutes. Accordingly, a polyimide layer having a three-layer structure was formed. Note that the heat treatment temperature was designated as polyimide formation temperature.

Subsequently, a rectangular piece having a length of 250 mm in the rolling direction of the copper plate and a width of 40 mm in the direction perpendicular to the rolling direction was cut out so that a one-side copper-clad laminate test piece having a resin layer (polyimide) with a thickness of 12 µm and a copper plate layer with a thickness of 12 µm was obtained. At this time, modulus of elasticity in tension of the entire resin layer was 7.5 GPa.

Next, the copper plate layer of each one-side copper-clad laminate test piece obtained above was covered with a certain mask. Etching was conducted using an iron chloride/copper chloride solution so as to form a wiring pattern in which the wiring direction of 10 linear wires each having a line width of 100 μm and a length of 40 mm became in parallel with the rolling direction and the space width became 100 μm. Thus, a flexible circuit board test piece was obtained. In the above wiring pattern, 10 wires arranged in rows were continuously connected via a U-shaped part and both ends of the connected wiring lines were provided with electrode parts for resistance value measurement. It was confirmed that the copper plate texture and the status of Cr precipitation were not changed before and after polyimide formation and circuit formation via etching.

Lock seaming test was conducted using the flexible circuit board test pieces obtained above. The rolling (wiring) direction was designated as the folding direction. In other words, a crease was formed in the direction orthogonal to the rolling direction so that the wiring side became the interior side after folding (i.e., a bending portion was formed so that the direction of bending was orthogonal to the in-plane <100> orientation of copper plate). Each flexible circuit board test piece was passed through a roller in parallel with the folding line while the roller was used to control a gap at the folding portion so that the gap became 0.3 mm. After all of 10 wires arranged in rows were folded, the folding portion was opened 180° to return to the original state, and the portion where the crease was formed was passed through the roller again while the test flexible circuit board was held. This series of steps was counted as a single instance of lock seaming. Folding and unfolding were repeated in such manner. The resistance values of wires were monitored. At a time point when resistance reached a certain level (3000Ω), it was judged that wiring breaking occurred. The number of times of folding (lock seaming life) until the occurrence of breaking of the copper plate was checked. Table 2 lists the results. Each result was expressed as a mean value of 5 tests for each sample.

[Table 2]

even though Cr precipitation was observed. Lock seaming life of the flexible circuit board with a percentage of the <100> preferred orientation region of 55.3%, for which sample 12 was used, was comparable to that of copper foil in which Cr precipitation did not occur. It was found that when the percentage of the <100> preferred orientation region reaches not less than 60.0% and more preferably more than 70.0%, lock seaming bending tolerability increases along with promotion of Cr precipitation.

Example 3

A test was conducted to determine whether embodiments of the present invention may be carried out when separate the Cr precipitation step and the recrystallization step. Scrap copper and Cr with a purity of not less than 99.5% by mass were used as raw materials. These were weighed in certain amounts, dissolved in a vacuum of not more than $10^{-2}$ Pa using a high-purity graphite crucible, and casted in a high-purity graphite mold which was cooled via water-cooled copper hearth. The ingot had a size of 30 mm×55 mm×12 mm. This was hot rolled at 700° C. so that a plate with a thickness of 1 mm was prepared. Hot rolling was conducted alternately in the 30-mm length direction and the 55-mm length direction by changing the hot rolling direction by 90° until the number of passages of the ingot reached 7. Middle annealing of a hot-rolled sheet with a thickness of 1 mm was conducted in nitrogen at 650° C. for 2 hours together with Cr precipitation treatment. This copper plate material was cold rolled to result in a thickness of 0.4 mm. Slitting was conducted to adjust the width to 40 mm. Then, cold rolling was conducted using a tension roller so that the final ND thickness was adjusted to 12 μm. The oriented copper plate having the final ND thickness which was obtained by rolling was analyzed for the Cr concentration by ICP spectrometry. As impurities other than Cr, 0.005% by mass of oxygen, 0.0016% by mass of Fe, 0.002% by mass of Ag, and 0.0015% by mass of Mn were detected. P, Ni, Sn, and Zn were not more than 0.001% by mass. The content of Cr

TABLE 2

| | Sample No. | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| Lock seaming life (#) | 135 | 129 | 149 | 173 | 165 | 191 | 161 | 146 | 181 | 171 | 161 | 132 | 105 |
| Remarks | Comparative Example (1) | Comparative Example (2) | Comparative Example | Example | Example (3) | Example (4) | Example | Comparative Example | Example | Example | Example | Comparative Example | Comparative Example |

The results of Table 2 indicated that when the oriented copper plate designated as sample 6 was used, the highest durability against lock seaming load was achieved, since the cube texture of sample 6 was developed and high levels of 0.2% proof stress, strength, and breaking elongation were achieved due to the effects of Cr precipitation. Among the oriented copper plates, samples in which the cube texture was developed to bring the percentage of the <100> preferred orientation region to about 99% were compared to each other. The comparison revealed that samples having greater effects of Cr precipitation had higher levels of lock seaming tolerability. Samples in which the cube texture was not developed had low levels of lock seaming tolerability contained as an impurity in copper foil (sample 14) prepared without the addition of Cr was 0.0011% by mass.

These samples were annealed in a nitrogen atmosphere at 400° C. for 5 minutes (recrystallization annealing). Annealing was conducted by an operation of inserting copper foil from the outside of a heating zone into a hot soaking zone of a tube furnace that had been heated in advance to 400° C., taking copper foil outside of the heating zone after the elapse of 5 minutes, and cooling copper foil without oxidizing it. The conditions simulated the heat history of consecutive steps of forming polyimide on copper foil.

Material structure and mechanical properties of produced copper foil were examined. The material structure was evaluated using EBSD employed for field-emission scanning electron microscopy (FE-SEM), and precipitation was evaluated by field-emission transmission electron microscopy (FE-TEM). In addition, tensile test was conducted for mechanical characteristics.

Textures of the oriented copper plates were obtained by performing mechanical and chemical polishing on the rolling surface of each oriented copper plate using colloidal silica and conducting orientation analysis using an EBSD system. The systems used herein were FE-SEM (ZEISS Ultra 55), an EBSD system (TSL), and software (OIM Analysis 5.2). The measurement area was of 800 µm×1600 µm. The accelerating voltage upon measurement was set to 20 kV and the measurement step interval was set to 4 µm (measurement was conducted so that measurement points formed a triangular lattice, the distance between measurement points was 4 µm, and the total measurement score was 92,631 points in the above region in this Example). In this Example, the density of the cube texture of the present invention, i.e., the <100> preferred orientation region, may be expressed as a percentage of the measurement points at which the <100> orientation has a difference of not more than 15° with respect to both the thickness direction of the copper plate and the rolling direction of the copper plate (i.e., the specific in-plane direction of the copper plate) with respect to the total measurement points. Two different visual fields were examined for each type of sample and the percentage was rounded to the nearest tenth to obtain the number of measurement points. Regarding all prepared samples, crystal grains forming the <100> preferred orientation region were large and some of them were greater than the above measured area.

Each of the copper plates was thinned by electropolishing and the precipitate in each copper plate was assessed using FE-SEM (HF-2000) manufactured by Hitachi. The thickness of the measured area of each sample was 0.15 µm. Measurement was carried out at an accelerating voltage of 200 kV. The orientation of copper matrix was confirmed by electron diffraction. Composition analysis using electron diffraction and EDS analysis systems was employed for identification of the precipitates. The size and density of each precipitate were determined by processing the resulting image, determining a projected area for the contrast image of each obtained precipitate, and calculating the equivalent circle diameter.

A specimen having a length of 150 mm and a width of 10 mm was cut out from each copper plate to conduct a tensile test at a gauge distance of 100 mm and a tensile speed of 10 mm/minutes in parallel to the rolling direction. A stress-strain diagram was created based on the results obtained from the tensile test for evaluation in terms of 0.2% proof stress value, strength, and breaking elongation. Stress is a value obtained by dividing a load on the load cell by the cross-sectional area of a copper plate before tensile test. Strain corresponds to displacement of a crosshead of a tensile tester with respect to the gauge distance, which is expressed as a percentage.

Next, copper foil cut in a shape similar to the shape of test pieces used in the tensile test was folded at the center of the length direction in the length direction by 90° or 60° to form a crease to such an extent that a sharp folding angle was created. Then, a folding compression test was repeatedly conducted using the system used for the tensile test. The center of the creased portion was compressed in the vertical direction in which the center was further creased via parallel plates, the gap between the plates was extended to 5 mm, and the center was compressed again then released, which were repeated 10 times. The maximum load upon compression was set to 10 N and the compression time was set to 5 seconds.

Thereafter, the status of crack generation on the ridge portion with a formed crease was checked using FE-SEM. Then, the crease was opened and the structure of a cracked portion was examined based on an SEM image by EBSD analysis.

Table 3 summarizes the results.

[Table 3]

TABLE 3

| Sample No. | Cr concentration (% by mass) | Percentage of <100> preferred orientation region (%) | Cr precipitate density (precipitates/µm³) | Cr precipitate mean grain size (nm) | 0.2% proof stress (MPa) | Strength (MPa) | Breaking elongation (%) | Cracks after folding test (90°) | Cracks after folding test (60°) | Remarks |
|---|---|---|---|---|---|---|---|---|---|---|
| 14 | 0.0011 | 69.8 | 0 | — | 32.9 | 67.1 | 6.9 | Large | Large | Comparative Example |
| 15 | 0.12 | 97.6 | 3211 | 7.1 | 95.4 | 155.0 | 2.9 | Not detected | Not detected | Example |
| 16 | 0.19 | 80.1 | 4608 | 16.1 | 97.9 | 174.3 | 3.8 | Not detected | Not detected | Example |
| 17 | 0.29 | 70.2 | 7013 | 19.6 | 102.3 | 180.4 | 4.2 | Small | Not detected | Example |
| 18 | 0.38 | 60.0 | 8027 | 25.3 | 106.3 | 201.3 | 4.9 | Small | Small | Example |

It was confirmed that Cr precipitation took place in copper foil samples other than sample 14, since a sufficient amount of Cr was added and Cr precipitation treatment was conducted via middle annealing at 650° C. for 2 hours.

The results of the status of Cr precipitation and the percentage of the <100> preferred orientation region revealed that both advanced cube texture formation and Cr precipitation promotion can be achieved even by conducting cold working after precipitation treatment and then conducting recrystallization annealing.

The maximum value of the amount of Cr added for bringing the <100> preferred orientation region to not less than 60.0% was 0.38% by mass and maximum value of the amount of Cr added for bringing the <100> preferred orientation region to more than 70.0% was less than 0.30% by mass. The range of the amount of Cr added is decreased, at which both advanced cube texture formation and Cr precipitation promotion can be achieved, since the heat history in the final annealing step was small.

The percentage of the <100> preferred orientation region of copper foil corresponding to sample 14 free from Cr was as small as about 70%, although the Cr content was small, since as the Cr content was small, crystal grains were coarsened as a result of middle annealing at 650° C. for 2 hours, and then, a cube orientation was not developed during final annealing as uniform processing strain was not introduced during cold working.

As cracks formed in the repetitive bending test, large cracks were observed in sample 14 while no cracks were observed in samples each having a large <100> preferred orientation region (samples 15 and 16). Cracks in sample 14 were generated in the interface between crystal grains having the <100> preferred orientation and crystal grains having different orientations or crystal grains other than crystal grains having the <100> preferred orientation. This indicates that an advanced cube texture and the absence of mechanical heterogeneity derived from crystal orientations result in strength against bending and fatigue.

Sample 17 having the <100> preferred orientation region comparable to that of sample 14 and sample 18 having a low percentage of <100> preferred orientation region had a fewer number of small cracks as a result of promotion due to Cr precipitation.

For applied use of a copper-clad laminate produced by laminating copper foil and polyimide, as explained in this Example, Cr precipitation was induced in the middle step, following which cold working was conducted, so that copper foil processed through precipitation and work-hardening treatment was used in the step of developing crystal grains having the <100> preferred orientation by utilizing heat generated during heating treatment in the step of laminating copper foil and polyimide. This is excellent in terms of handling and efficiency. In such a case, the Cr concentration may be not more than 0.38% by mass, desirably less than 0.30% by mass, and more desirably less than 0.20% by mass. The optimal value would vary depending on the heat history of the step of laminating copper foil and polyimide. It is desirable to maximize the Cr content in a range in which crystal grains having the <100> preferred orientation can be developed.

For further comparison, The similar test was conducted using sample 16b which was produced by the process for producing sample 16, for which good results had been obtained, except that middle annealing involving precipitation treatment at 650° C. for 2 hours was not conducted. No cracks were observed in 60°-direction bending test pieces after the bending test while fine cracks were observed in 90°-direction bending test pieces.

The percentage of the <100> preferred orientation region of sample 16b was 70.9% and the strength thereof was 148 Pa. The strength was smaller than that of sample 16, since the amount of Cr precipitates decreased as precipitation heat treatment was not conducted, resulting in a small action of promoting precipitation. In addition, the area percentage of the <100> preferred orientation region of sample 16b was smaller than that of sample 16, since a large amount of Cr solid solution in copper caused the recrystallization temperature to increase to a level greater than that of sample 16, thereby preventing sufficient progress in recrystallization under the final annealing conditions of the present invention.

In other words, bending fatigue characteristics of sample 16b were smaller than those of sample 16, since the strength of sample 16b was small, and reduction of the percentage of the <100> preferred orientation region caused mechanical heterogeneity derived from the orientation difference of each crystal grain to increase, which induced microscopic stress concentration and increased the probability of crack generation.

Example 4

A test was conducted to examine impurities other than Cr. Oxygen-free copper having a purity of not less than 99.96%, Cr, Zr, Zn, and phosphorus deoxidized copper containing 2.8% by weight of P were used as raw materials. These were weighed in certain amounts, dissolved in a vacuum of not more than $10^{-2}$ Pa using a high-purity graphite crucible, and casted in a high-purity graphite mold cooled via water-cooled copper hearth. The ingot had a size of Φ20 mm×100 mm. The surface thereof was reduced by swaging to result in Φ6 mm. The ingot was stretched via cross rolling such that a tape-shaped plate material having a width of 18 mm and a thickness of 1.5 mm was obtained. The thickness was adjusted to 0.2 mm via cold rolling, following which slitting was conducted in the length direction such that a tape-shaped plate material having a width of 1.3 mm and a thickness of 0.2 mm was obtained. This material was wound around a stainless-steel bobbin, followed by precipitation, recrystallization, and annealing in vacuum at 650° C. for 2 hours. Thus, a final sample was obtained.

In an evaluation test, impurity analysis by ICP emission spectrometry and a 90° bending test were conducted and the material structure before and after the bending test was examined.

The material textures were evaluated by EBSD combined with field-emission scanning electron microscopy (FE-SEM) and precipitates were evaluated by field-emission transmission electron microscopy (FE-TEM).

Textures of the oriented copper plates were obtained by performing mechanical and chemical polishing on the rolling surface of each oriented copper plate using colloidal silica and conducting orientation analysis using an EBSD system. The systems used herein were FE-SEM (ZEISS Ultra 55), an EBSD system (TSL), and software (OIM Analysis 5.2). The measurement area was of 800 μm×1600 μm. The accelerating voltage upon measurement was set to 20 kV and the measurement step interval was set to 4 μm (measurement was conducted so that measurement points formed a triangular lattice, the distance between measurement points was 4 μm, and the total measurement score was 92,631 points in the above region in this Example). In this Example, the density of the cube texture of the present invention, i.e., the <100> preferred orientation region, may be expressed as a percentage of the measurement points at which the <100> orientation has a difference of not more than 15° with respect to both the thickness direction of the copper plate and the rolling direction of the copper plate (i.e., the specific in-plane direction of the copper plate) with respect to the total measurement points. Two different visual fields were examined for each type of sample and the percentage was rounded to the nearest tenth to obtain the number of measurement points.

90° bending test was conducted using a wiring system for producing strings by wiring crystalline silicon solar cells (NPC Incorporated: full automatic wiring system) (NTS-150-SM). This wiring system is capable of feeding a tape-shaped plate material from a bobbin at a certain tension, cutting the tape-shaped plate material to a length of 320 m, and embossing the center portion of a cut piece of the tape-shaped plate material using a step mold so as to form two 90° folds, which are a mountain fold and a valley fold, in a direction vertical to the length direction and the normal direction. Thus, the plate material to have a gap of about 150 μm in the thickness direction at the center portion of the length direction, and therefore bond an acceptance surface of a solar cell may be bonded a back face of an adjacent solar cell, by narrowing the distance between the cells.

In this Example, the generation or non-generation of cracks was examined by observing the bending portion on the tension face of the step mold by FE-SEM. Table 4 summarizes the results.

[Table 4]

TABLE 4

| Sample No. | Cr concentration (% by mass) | Zr concentration (% by mass) | P concentration (% by mass) | Zn concentration (% by mass) | Percentage of <100> preferred orientation region (%) | Cracks at bending portion | Remarks |
|---|---|---|---|---|---|---|---|
| 19 | 0.08 | 0.05 | — | — | 96.8 | Not detected | Example |
| 20 | 0.08 | 0.10 | — | — | 80.9 | Not detected | Example |
| 21 | 0.08 | — | 0.003 | — | 80.1 | Not detected | Example |
| 22 | 0.08 | — | 0.01 | — | 55.8 | Detected | Comparative Example |
| 23 | 0.08 | — | — | 0.03 | 86.3 | Not detected | Example |
| 24 | 0.08 | — | — | 0.10 | 59.8 | Detected | Comparative Example |

As a result of the adjustment of the Cr concentrations to a certain level of 0.08% by mass, the analytical values were also 0.08% by mass. The analytical values obtained for Zr, P, and Zn were substantially identical to their concentrations in the composition upon preparation.

The percentage of the <100> preferred orientation region for samples containing Zr was not less than 80.0%, even though the concentration of Zr was 0.1% by mass. On the other hand, no sample having the <100> preferred orientation region at not less than 60.0% was obtained among sample 22 containing P at 0.01% by mass, sample 24 containing Zn at 0.1% by mass.

As a result of observation of cracks after the bending test, cracks were observed in samples 22 and 24. On the other hand, no cracks were observed in other samples having large <100> preferred orientation regions. Cracks observed in samples 22 and 24 were generated in the interface between crystal grains having the <100> preferred orientation and crystal grains having a different orientation or the interface between crystal grains having the <100> preferred orientation and crystal grains other than crystal grains having the <100> preferred orientation. Such cracks become the origin of generation of breaking defects of copper wiring, which are called "inter connector breaks," when a load is repeatedly applied by wind and snow to solar cell modules.

In this Example, it was revealed that in order to achieve the increase of both Cr precipitation and the <100> preferred orientation region, other components may be limited, and in particular, in order to obtain the effects of the present invention, P may be limited to less than 0.01% by mass and Zn may be limited to less than 0.10% by mass.

INDUSTRIAL APPLICABILITY

As stated above, an oriented copper plate may be provided, which has high levels of yield strength, mechanical strength, and breaking elongation greater than those of conventional materials having similar levels of cube texture concentration by material structure characteristics of both advanced cube texture and Cr precipitation, and excellent folding flexibility, which can be used a wide range of applications such as solar cell wiring materials and various circuit board materials having an insulating layer composed of plastic or ceramic. In particular, it is preferable as a flexible circuit board for devices, in which a bending portion is formed, the bending portion needing to be frequently folded via repetition of actions such as rotary slide bending, folding bending, hinge bending, and lateral slide bending and having a very small radius of curvature. Therefore, such a flexible circuit board can be suitably used for a variety of electronics such as thin mobile phones which needs durability, thin displays, hard disks, printers, and DVD devices.

What is claimed is:

1. An oriented copper plate, which contains 0.03% by mass to 1.0% by mass of Cr, the remainder of which is composed of copper and inevitable impurities, wherein the copper plate has a <100> main orientation so that the area percentage of a <100> preferred orientation region is not less than 60.0%, the region satisfying a condition that allows each of a thickness direction of the copper plate and a specific in-plane direction of the copper plate to have an orientation difference of not more than 15° with respect to a <100> copper crystal axis, and wherein Cr precipitates having equivalent circle diameters of 4 nm to 52 nm are present at 300 precipitates/$\mu m^3$ to 12000 precipitates/$\mu m^3$.

2. The oriented copper plate according to claim 1, which further contains one or two or more of: Mn: not more than 0.4% by mass; Al: not more than 0.4% by mass; Ti: not more than 0.2% by mass; Zr: not more than 0.2% by mass; and rare earth elements: not more than 0.4% by mass.

3. The oriented copper plate according to claim 1, which further contains one or two of: P: less than 0.01% by mass; and Zn: less than 0.1% by mass.

4. The oriented copper plate according to claim 1, which further contains, at a total concentration of less than 0.03% by mass, one or two or more selected from the group consisting of: Ag, Sn, Pd, Ni, Fe, B, Si, Ca, V, Co, Ga, Ge, Sr, Nb, Mo, Rh, Ba, W, and Pt.

5. A copper-clad laminate, which has an insulating layer formed on a surface of the oriented copper plate according to claim 1.

6. The copper-clad laminate according to claim 5, wherein the oriented copper plate has a thickness of 5 μm to 18 μm, and the insulating layer is composed of a resin and has a thickness of 5 μm to 75 μm.

7. The copper-clad laminate according to claim 6, wherein the resin is composed of polyimide.

8. A flexible circuit board, which has a certain wiring formed on the oriented copper plate of the copper-clad laminate according to claim 5, which further has a bending portion at least one site of the wiring in a direction orthogonal to a specific in-plane direction of the copper plate.

9. The flexible circuit board according to claim 8, wherein the bending portion is a bending portion which conducts one or two or more repetitive actions selected from the group consisting of lock seaming bending, rotary slide bending, folding bending, hinge bending, and lateral slide bending.

10. An electronic device, which is equipped with the flexible circuit board according to claim 8.

* * * * *